(12) United States Patent
Ishigaki et al.

(10) Patent No.: US 7,038,244 B2
(45) Date of Patent: May 2, 2006

(54) SEMICONDUCTOR DEVICE AND METHOD OF MANUFACTURING THE SAME

(75) Inventors: Takashi Ishigaki, Kanagawa (JP); Takaki Niwa, Kanagawa (JP); Naoto Kurosawa, Kanagawa (JP); Hidenori Shimawaki, Tokyo (JP)

(73) Assignees: NEC Compound Semiconductor Devices, Ltd., Kawasaki (JP); NEC Corporation, Tokyo (JP)

( * ) Notice: Subject to any disclaimer, the term of this patent is extended or adjusted under 35 U.S.C. 154(b) by 0 days.

(21) Appl. No.: 10/994,261

(22) Filed: Nov. 23, 2004

(65) Prior Publication Data

US 2005/0110045 A1 May 26, 2005

(30) Foreign Application Priority Data

Nov. 26, 2003 (JP) ............................. 2003-396035

(51) Int. Cl.
*H01L 29/22* (2006.01)
*H01I 31/0328* (2006.01)

(52) U.S. Cl. ..................... 257/94; 257/197; 257/477; 257/565

(58) Field of Classification Search ............... 257/565, 257/197, 477
See application file for complete search history.

(56) References Cited

U.S. PATENT DOCUMENTS 5,340,755 A * 8/1994 Zwicknagl et al. ......... 438/312
2004/0065897 A1 * 4/2004 Lee et al. .................... 257/197

FOREIGN PATENT DOCUMENTS

JP       2002-299603     10/2002

* cited by examiner

*Primary Examiner*—Jerome Jackson
*Assistant Examiner*—Joseph Nguyen
(74) *Attorney, Agent, or Firm*—McGinn IP Law Group, PLLC (57) ABSTRACT

A semiconductor device includes a sub-collector layer, a collector layer, a base layer, an emitter layer, and an emitter cap layer, which are sequentially laminated on a substrate. It also includes an emitter electrode, a base electrode, and a collector electrode, which are respectively formed on the emitter cap layer, the base layer, and the sub-collector layer. The sub-collector layer is made up of a first sub-collector layer adjacent to the substrate and a second sub-collector layer adjacent to the collector layer. In the area between adjacent device elements, the first sub-collector layer has an element insulating region created by ion implantation, and the second sub-collector layer has a recess-shaped element insulating region.

5 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device such as heterojunction bipolar transistor (HBT) and a method of manufacturing the same. Particularly, the present invention relates to a semiconductor device which ensures electrical isolation between device elements such as HBT and easily achieves high current gain, high reliability, and planarization while reducing collector resistance to enhance the efficiency of an amplifier, and a method of manufacturing the same.

2. Description of Related Art

A typical example of HBT is fabricated on a semi-insulating gallium arsenide (GaAs) substrate. A sub-collector layer, a collector layer, a base layer, an emitter layer, and an emitter cap layer are epitaxially grown on the semi-insulating GaAs substrate. Further, an emitter electrode, a base electrode, and a collector electrode are respectively formed on the emitter cap layer, the base layer, and the sub-collector layer. In a high-power amplifier using the HBT, it is necessary to reduce collector resistance to as low as possible in order to enhance the efficiency, which is one of the important factors for a high-performance amplifier.

In the HBT, a current path is created from the collector layer to the collector electrode through the conductive sub-collector layer. The resistance against the current flowing through the sub-collector layer, which is referred to hereinafter as "access resistance", constitutes part of the collector resistance. On the other hand, in order to electrically isolate device elements such as transistors from each other, it is necessary to insulate the sub-collector layer between the elements.

Figure 1A:
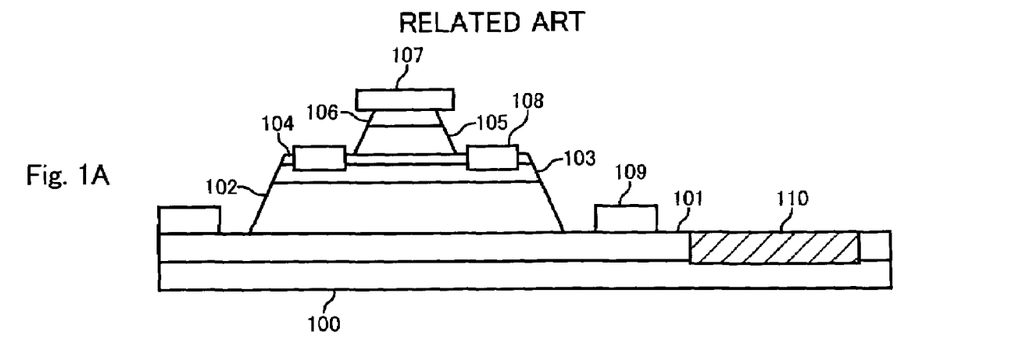
FIGS. 1A and 1B are cross sectional views showing the partial structures of conventional semiconductor devices.
Figure 1B:
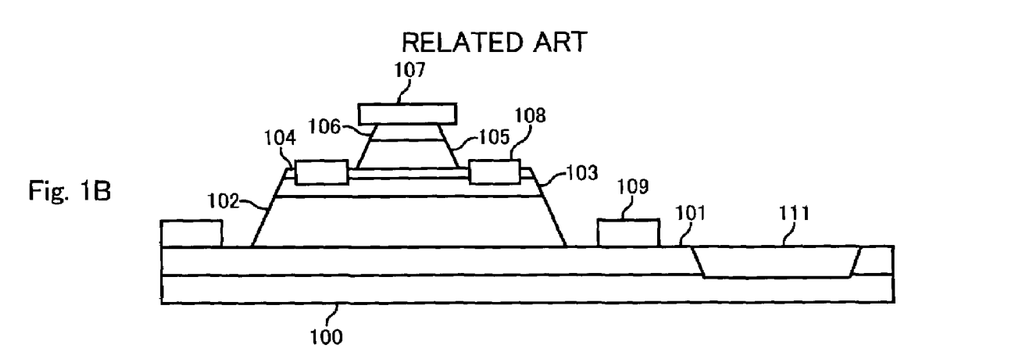

FIGS. 1A and 1B show examples of conventional semiconductor devices. On a semi-insulating GaAs substrate 100, a sub-collector layer 101 formed of n-type GaAs, a collector layer 102 formed of n-type or non-doped GaAs, a base layer 103 formed of p-type GaAs, an emitter layer 104 formed of n-type InGaP or AlGaAs lattice-matched to GaAs, an emitter cap layer 105 formed of n-type GaAs, and an emitter cap layer 106 formed of InGaAs are laminated sequentially. Further, an emitter electrode 107 formed of WSi is placed on the emitter cap layer 106. A base electrode 108 formed of Pt/Ti/Pt/Au is placed on the base layer 103. A collector electrode 109 formed of Ni/AuGe/Au is placed on the collector layer 101. These components constitute a HBT device.

In order to insulate the sub-collector layer 101 between device elements, the semiconductor device of FIG. 1A has an element insulating region 110 created by ion implantation, and the semiconductor device of FIG. 1B has an element insulating region 111, which is a recess, formed by removing the sub-collector layer 101 by etching.

A method of manufacturing the semiconductor device is explained hereinafter with reference to FIGS. 2A to 2D, which show the configurations in the course of the process to form the device of FIG. 1.

Figure 2A:
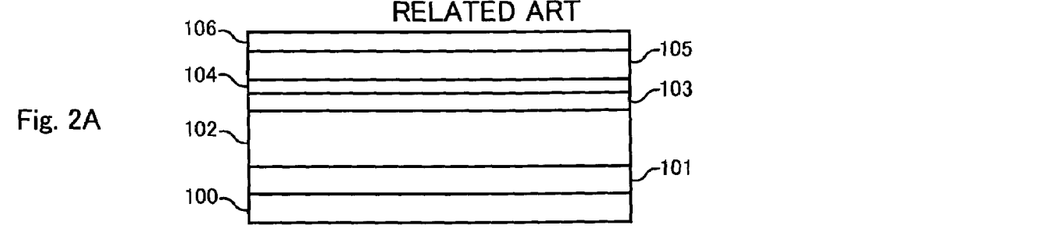
FIGS. 2A to 2D are cross sectional views showing the partial structures in the course of manufacturing the semiconductor device of FIGS. 1A or 1B.
Figure 2B:
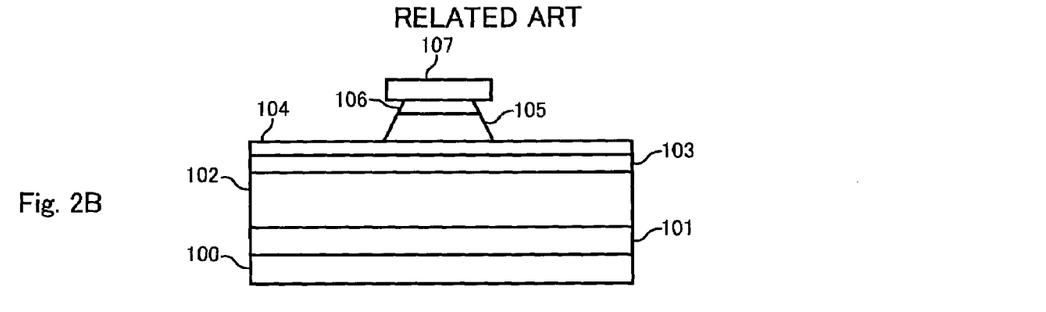

First, as shown in FIG. 2A, an epitaxial wafer in which the sub-collector layer 101, collector layer 102, base layer 103, emitter layer 104, emitter cap layer 105, and emitter cap layer 106 are sequentially laminated on the substrate 100 is formed. Next, WSi, which serves as the emitter electrode 107, is deposited by sputtering on one surface of the epitaxial wafer. The emitter electrode 107 is then formed by dry etching, using a patterned photoresist mask. Using the emitter electrode 107 as a mask, etching is performed with sulfuric etchant to expose the surface of the emitter layer 104. The emitter cap layers 105, 106, and emitter electrode 107 are thereby shaped as shown in FIG. 2B.

Figure 2C:
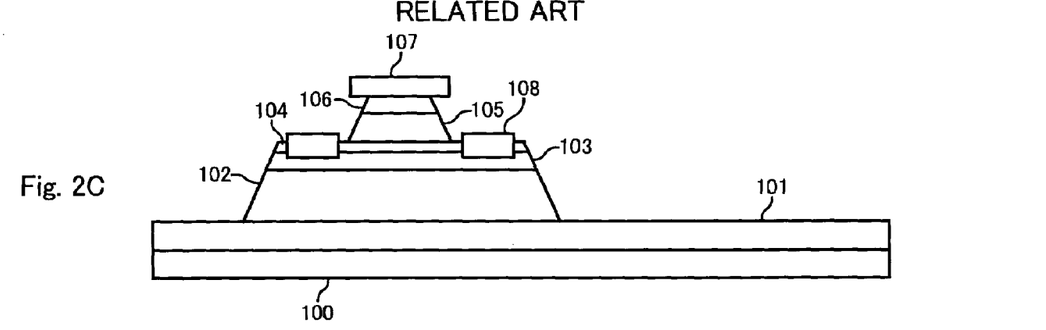

Then, Pt/Ti/Pt/Au is deposited on the emitter layer 104 by evaporation and lift-off process. The Pt/Ti/Pt/Au is sintered by alloy process to contact with the base layer 103, thereby forming the base electrode 108. Then, etching is performed using a patterned photoresist as a mask to expose the sub-collector layer 101. The configuration of FIG. 2C is thereby created.

Figure 2D:
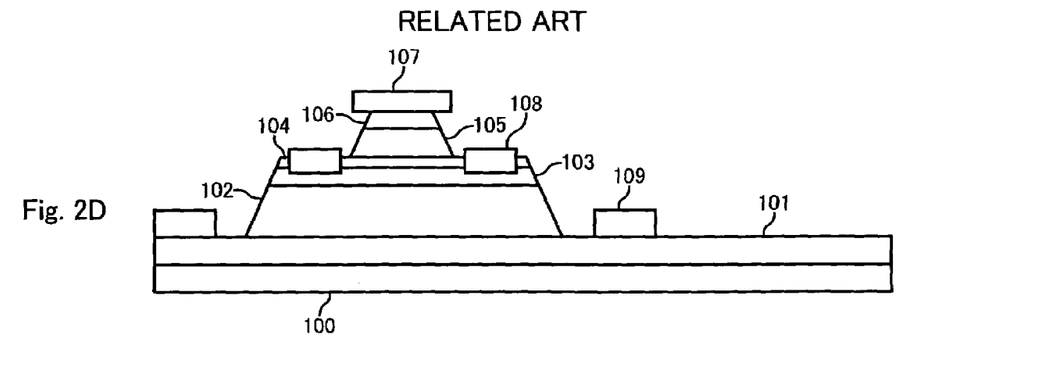

Then, the collector electrode 109 is formed on the sub-collector 101 by the evaporation and lift-off process. The configuration of FIG. 2D is thereby created.

After that, the element insulating region 110 shown in FIG. 1A is created by ion implantation with boron and so on, using a photoresist as a mask. It allows insulation of the sub-collector layer 101 between elements. Alternatively, the recess-shaped element insulating region 111 shown in FIG. 1B may be formed by etching the sub-collector layer 101. It also allows insulation of the sub-collector layer 101 between elements.

As described above, reduction of the collector resistance is critical to increase the amplifier efficiency of the semiconductor device. The access resistance constituting part of the collector resistance is determined by sheet resistance of the sub-collector layer. The sheet resistance can be reduced by increasing the thickness of the sub-collector layer or by increasing the impurity concentration of the sub-collector layer. Currently, a normal thickness of the sub-collector layer is in the range of 100 to 700 nm, and a normal doping concentration is in the range of $1*10^{18}/cm^3$ to $6*10^{18}/cm^3$.

If the thickness of the sub-collector layer exceeds the above range, it is difficult to completely insulate the sub-collector layer between elements by ion implantation with boron and so on. Though the ion implantation with proton, helium and the like allows deep implantation, it degrades reliability.

In the case of insulating the sub-collector layer between elements by a recess, it is necessary to form a recess whose depth equals the thickness of the sub-collector layer. Thus, if the sub-collector layer is thick, a step height on the sub-collector layer is large. This poses a problem for the subsequent manufacturing process such as planarization.

If, on the other hand, the doping concentration of the sub-collector layer exceeds the above range, it causes problems such as decrease in current gain and degradation in reliability.

Japanese Unexamined Patent Application Publication No. 2002-299603 (Tanomura, et al.) describes a heterojunction semiconductor device which overcomes problems of instable collector resistance in high-temperature testing and so on while the collector resistance is reduced as low as possible and eliminates the dislocation into a base layer to increase current gain or enhance reliability while minimizing the collector resistance. Tanomura teaches to form the delta-doped sheet region of a given concentration between the collector layer and the collector electrode on the surface of the sub-collector layer.

However, Tanomura does not mention the insulation between device elements.

As described above, the present invention has recognized that conventional heterojunction semiconductor devices have a problem that increasing the thickness of the sub-collector layer for higher amplifier efficiency sacrifices the insulation of the sub-collector between device elements.

SUMMARY OF THE INVENTION

In order to obtain high insulation reliability and allow easy planarization in spite of increase in the thickness of the sub-collector layer and to obtain high current gain and reliability in spite of increase in the impurity concentration of the sub-collector layer, the present invention forms a sub-collector layer with two laminated layers. Further, the invention implants ion into a first sub-collector layer adjacent to the substrate, and forms a recess in a second sub-collector layer where a collector electrode is placed, thus creating an element insulating region in each layer.

Furthermore, the present invention places an etching stop layer between the first and second sub-collector layers, and creates an element insulating region by ion implantation or recess formation using the etching stop layer.

In the semiconductor device and the method of manufacturing the same according to this invention, the sub-collector layer is made up of two laminated layers. Thus, the collector resistance can be reduced in the semiconductor device area. To create an element insulating region in the sub-collector layer, ion is implanted into the first layer adjacent to the substrate, and a recess is formed in the second layer where the collector electrode is placed. Since each of the first and second sub-collector layers has half the thickness required for resistance reduction, the ion implantation is ensured, and the planarization is easily achieved because of the low recess height.

In the case of making up the sub-collector layer only with the first and second sub-collector layers, it is needed to use two different materials having etching selectivity against each other for the first and second layers in consideration of the etching for recess formation. This need can be avoided by inserting the etching stop layer between the first and second sub-collector layers. This expands the range of choices for materials.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The present invention ensures electrical isolation of elements in spite of increase in the thickness of the sub-collector layer as a means of reducing the collector resistance of the sub-collector layer adjacent to the collector electrode in order to enhance the efficiency of an amplifier in HBT and so on. To achieve high current gain and high reliability while ensuring the ion implantation and facilitating the planarization process by reducing the recess height, the present invention forms the sub-collector layer with two laminated layers, in which ion is implanted into the layer in the substrate side and a recess is formed in the layer in the surface side. For easier ion implantation and recess formation, the two sub-collector layers may be made of the same material, with an etching stop layer placed therebetween.

FIRST EMBODIMENT

A first embodiment of the present invention is explained hereinafter with reference to FIG. 3.

Figure 3:
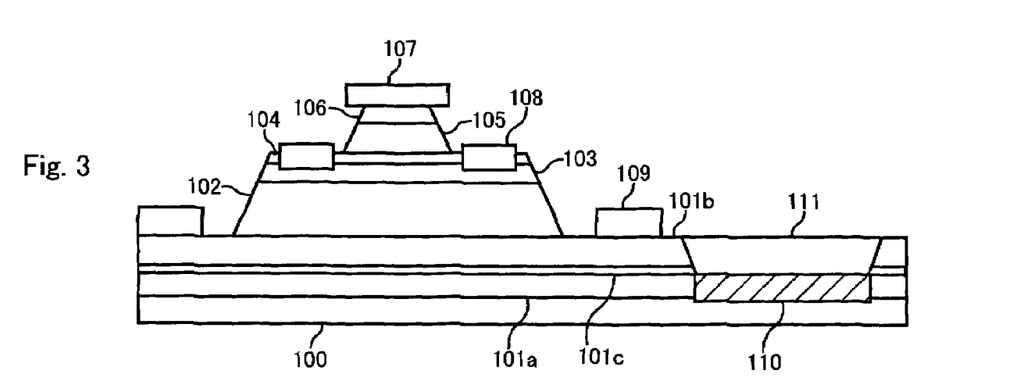
FIG. 3 is a cross sectional view showing a example of the partial structure of a semiconductor device according to a first embodiment of the invention.

FIG. 3 is an explanatory view showing an example of the cross section of one device element of the semiconductor device according to the present invention. On a semi-insulating GaAs substrate 100, a first sub-collector layer 101a, an etching stop layer 101c, a second sub-collector layer 101b, a collector layer 102, a base layer 103, an emitter layer 104, an emitter cap layer 105, and an emitter cap layer 106, each having a given shape, are sequentially laminated.

Unlike the conventional one, the sub-collector layer of this embodiment consists of three laminated layers: the first sub-collector layer 101a at the bottom, the etching stop layer 101c, and the second sub-collector layer 101b at the top. The first sub-collector layer 101a has an element insulating region 110 made by ion implantation. The second sub-collector layer 101b has a recess-shaped element insulating region 111 penetrating into the etching stop layer 101c.

Preferably, the first and second sub-collector layer 101b and 101a are formed of GaAs, and the etching stop layer 101c is formed of AlGaAs, InGaP, or InGaAsP, for example. For another example, the first and second sub-collector layers 101a and 101b are formed of AlGaAs, and the etching stop layer 101c is formed of InGaP or InGaAsP. For still another example, the first and second sub-collector layers 101a and 101b are formed of InGaAs, and the etching stop layer 101c is formed of InGaP or InGaAsP. The first and second sub-collector layers 101a and 101b preferably have the thickness of about 500 nm and the doping concentration of $1*10^{18}/cm^3$ or above.

Since the etching stop layer 101c normally has higher resistance than the sub-collector layers 101a and 101b, its thickness is as thin as 1 to 10 nm. If the etching stop layer 101c is formed of InGaP having a crystal structure in which superlattice ordering partially occurs, it is possible to reduce the resistance between the sub-collector layers 101a and 101b since the InGaP does not induce a potential barrier with GaAs of the sub-collector layers 101a and 101b.

Other components may be made of the same materials as conventional ones or other materials having the same function. For example, as is the conventional case, the collector layer 102 may be formed of n-type or non-doped GaAs, the base layer 103 may be formed of p-type GaAs, the emitter layer 104 may be formed of n-type InGaP or AlGaAs lattice-matched to GaAs, the emitter cap layer 105 may be formed of n-type GaAs, and the emitter cap layer 106 may be formed of InGaAs.

The emitter electrode 107 formed of WSi is placed on the emitter cap layer 106. The base electrode 108 formed of Pt/Ti/Pt/Au is placed on the base layer 103. The collector electrode 109 formed of Ni/AuGe/Au is placed on the collector layer 101. The HBT device is thereby composed.

A method of manufacturing the semiconductor device is explained hereinafter with reference to FIGS. 4A to 4E, which show the configurations in the course of the process to form the device of FIG. 3.

Figure 4A:
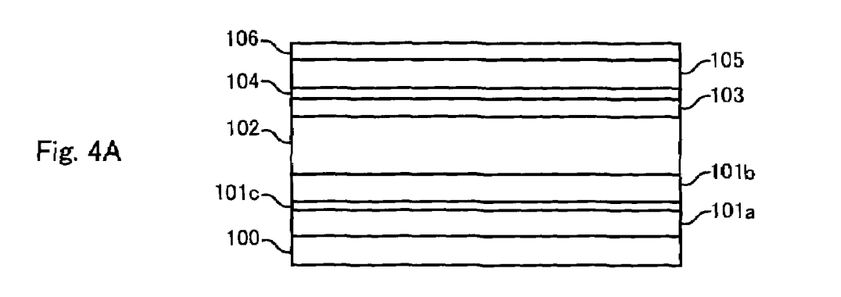
FIGS. 4A to 4E are cross sectional views showing the partial structures in the course of manufacturing the semiconductor device of FIG. 3.
Figure 4B:
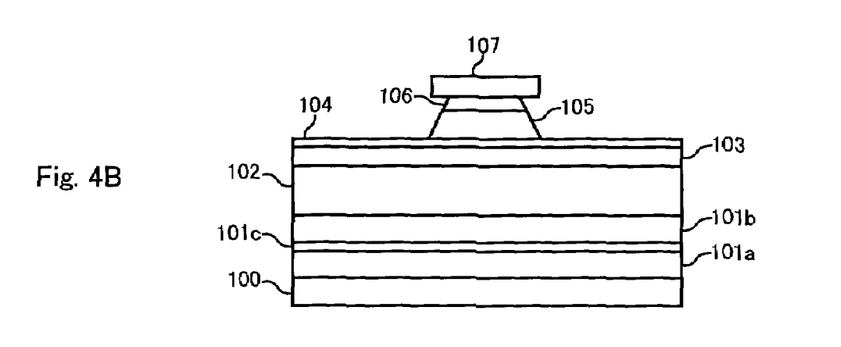

First, as shown in FIG. 4A, an epitaxial wafer in which the sub-collector layer 101a, etching stop layer 101c, sub-collector layer 101b, collector layer 102, base layer 103, emitter layer 104, emitter cap layer 105, and emitter cap layer 106 are sequentially laminated on the substrate 100 is formed. Next, WSi, which serves as the emitter electrode 107, is deposited by sputtering on one surface of the epitaxial wafer, and it is patterned with photoresist. Using the patterned photoresist as a mask, dry etching is performed to form the emitter electrode 107. Then, using the emitter electrode 107 as a mask, etching is performed with sulfuric etchant to expose the surface of the emitter layer 104. The emitter cap layers 105, 106, and emitter electrode 107 are thereby shaped as shown in FIG. 4B.

Figure 4C:
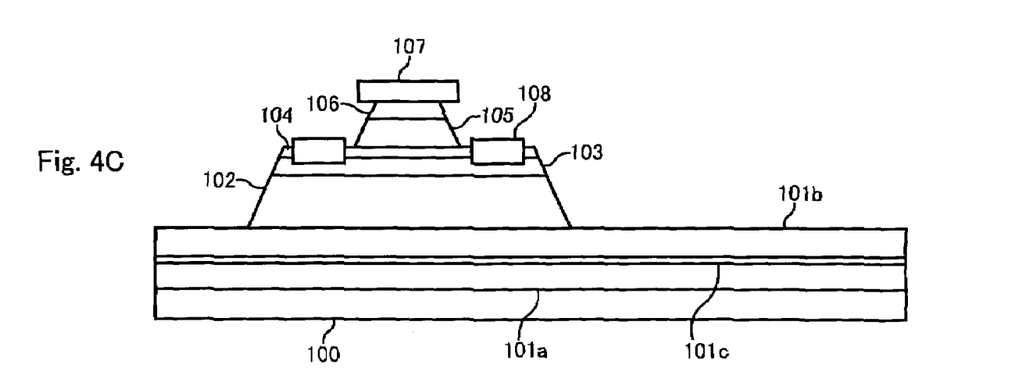

After that, Pt/Ti/Pt/Au is deposited on the emitter layer 104 by evaporation and lift-off process. The Pt/Ti/Pt/Au is sintered by alloy process so as to contact with the base layer 103, thereby forming the base electrode 108. After that, etching is performed using a patterned photoresist as a mask to expose the sub-collector layer 101. The configuration of FIG. 4C is thereby obtained.

Figure 4D:
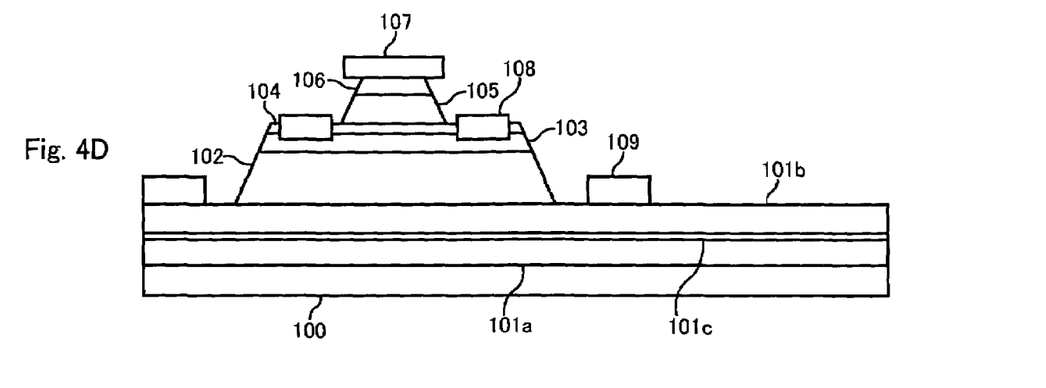

Then, the collector electrode 109 is formed on the sub-collector 101 by the evaporation and lift-off process. The configuration of FIG. 4D is thereby obtained.

Figure 4E:
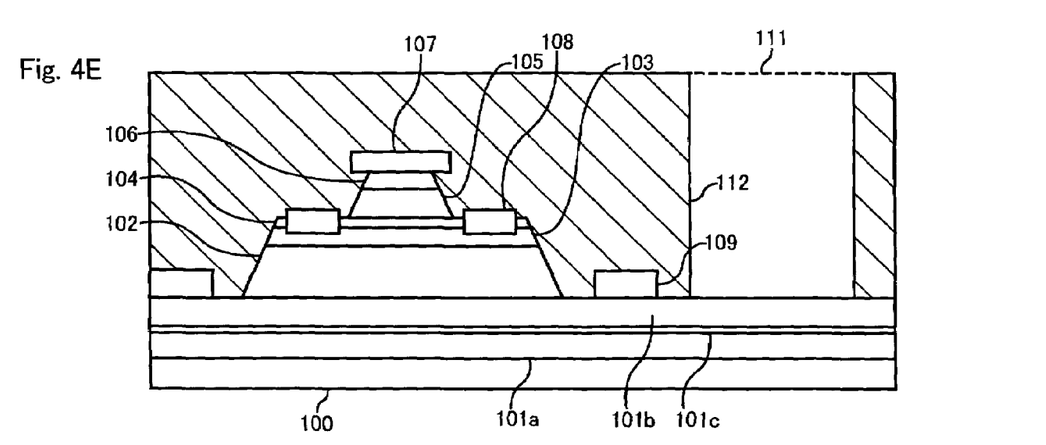

A photoresist 112 is then deposited as shown in FIG. 4E. Using the photoresist 112 as a mask, selective etching is performed above the element insulating region 111.

In this selective etching, the second sub-collector layer 101b is selectively etched away, using the etching stop layer 101c as a stopper. Further, the etching stop layer 101c is selectively etched away to expose the first sub-collector layer 101a. The recess-shaped element insulating region 111 is thereby formed. Then, ion is implanted into the first sub-collector layer 101a between adjacent device elements, thereby forming the element insulating region 110. The dopant ion is boron and so on. The configuration of FIG. 3 is thus formed, allowing insulation of the first sub-collector layer 101a from adjacent device elements.

Since the sub-collector layer 101 in the ion implantation area consists of a single layer of the first sub-collector layer 101a, the ion implantation can be performed easily. On the other hand, since the sub-collector layer in the device element area consists of two layers of the first and second sub-collector layers 101a and 101b sandwiching the etching stop layer 101c, the sub-collector layer of this area is thick enough to allow reduction of the sheet resistance in the device element area, thus reducing the access resistance to achieve low collector resistance.

SECOND EMBODIMENT

A second embodiment of the present invention is explained hereinafter with reference to FIG. 5.

Figure 5:
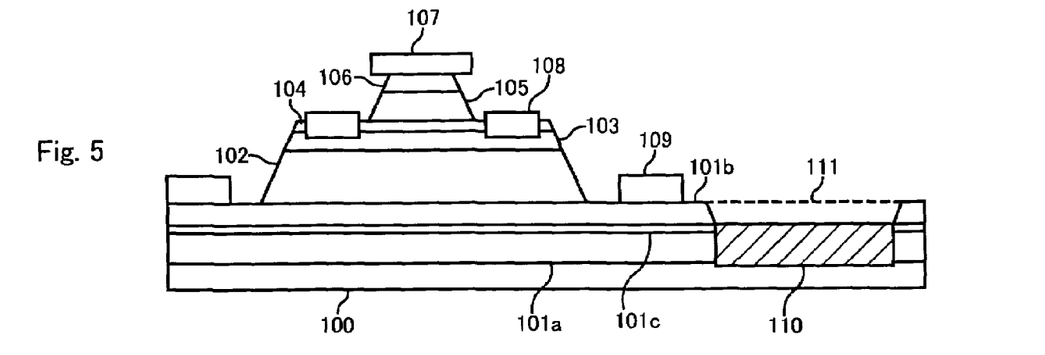
FIG. 5 is a cross sectional view showing a example of the partial structure of a semiconductor device according to a second embodiment of the invention.

FIG. 5 is an explanatory view showing an example of the cross section of a semiconductor device different from the above-described device. The same elements as in FIG. 3 are denoted by the same reference symbols and redundant description is omitted.

In this embodiment, the second sub-collector layer 101b only is selectively etched away using the etching stop layer 101c as a stopper, thereby creating the recess-shaped element insulating region 111. The etching stop layer 101c is not etched away. Then, ion implantation with boron and so on is performed both on the exposed etching stop layer 101c and the first sub-collector layer 101a, thereby creating the element insulating region 110 to insulate adjacent device elements from each other.

This configuration offers substantially the same effect as the above embodiment.

THIRD EMBODIMENT

A third embodiment of the present invention is explained hereinafter with reference to FIG. 6.

Figure 6:
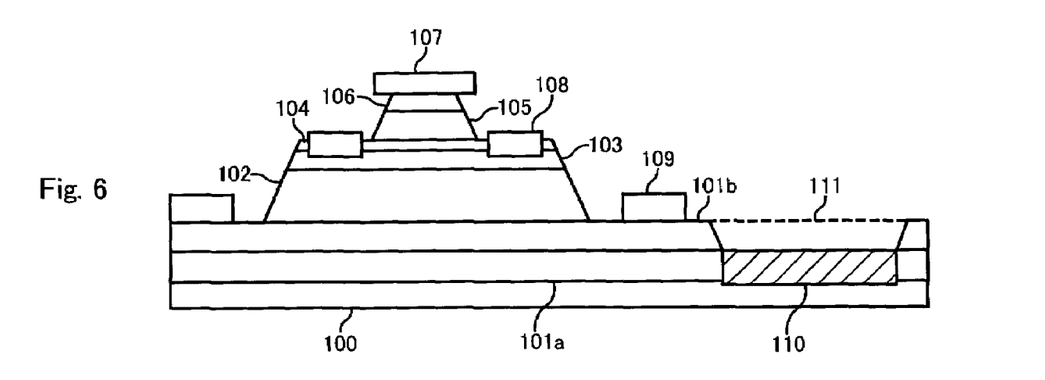
FIG. 6 is a cross sectional view showing a example of the partial structure of a semiconductor device according to a third embodiment of the invention.

FIG. 6 is an explanatory view showing an example of the cross section of a semiconductor device different from the above-described devices. The same elements as in FIG. 3 are denoted by the same reference symbols and redundant description is omitted.

This embodiment is different from the above embodiment in that it eliminates the etching stop layer.

Thus, the first sub-collector layer 101a is made of the material which has etching selectivity against the second sub-collector layer 101b.

For example, the first sub-collector layer 101a is formed of GaAs, and the second sub-collector layer 101b is formed of AlGaAs, InGaP, or InGaAsP. For another example, the first sub-collector layer 101a is formed of AlGaAs, and the second sub-collector layer 101b is formed of InGaP or InGaAsP. For still another example, the first sub-collector layer 101a is formed of InGaAs, and the second sub-collector layer 101b is formed of InGaP or InGaAsP.

In this embodiment, firstly, the second sub-collector layer 101b is selectively etched away using the first sub-collector layer 101a as a stopper, thereby creating the recess-shaped element insulating region 111. Then, ion implantation with boron and so on is performed on the exposed first sub-collector layer 101a, thereby creating the element insulating region 110 in the sub-collector layer 101a. This allows insulation of adjacent device elements.

This configuration offers substantially the same effect as the above embodiments.

This invention allows easy formation of an element insulating region for device element insulation by using two laminated sub-collector layers. This configuration is suitable for applications that require low collector resistance, easy planarization, and high reliability with secure element insulation. For example, it is applicable to the semiconductor device having the configuration taught by Tanomura.

It is apparent that the present invention is not limited to the above embodiment and it may be modified and changed without departing from the scope and spirit of the invention.

What is claimed is:

1. A semiconductor device including a sub-collector layer, a collector layer, a base layer, an emitter layer, and an emitter cap layer sequentially laminated on a substrate, and an emitter electrode, a base electrode, and a collector electrode respectively formed on the emitter cap layer, the base layer, and the sub-collector layer, wherein the sub-collector layer comprises a first sub-collector layer adjacent to the substrate and a second sub-collector layer adjacent to the collector layer, and the first sub-collector layer includes an element insulating region created by ion implantation, and the second sub-collector layer includes a recess-shaped element insulating region, each region created between adjacent device elements.

2. The semiconductor device according to claim 1, wherein the first and second sub-collector layers are formed of different materials having etching selectivity against each other.

3. The semiconductor device according to claim 1, further comprising an etching stop layer placed between the first and second sub-collector layers, allowing selective etching for each of the first and second sub-collector layers, and including the recess-shaped element insulating region continuing from the second sub-collector layer.

4. The semiconductor device according to claim 1, further comprising an etching stop layer placed between the first and second sub-collector layers, allowing selective etching for each of the first and second sub-collector layers, and including the element insulating region continuing from the first sub-collector layer, created by ion implantation.

5. The semiconductor device according to claim 4, wherein the etching stop layer is formed of InGaP having a crystal structure where superlattice ordering partially occurs.

* * * * *